United States Patent [19]

Jurek

[11] 4,254,466

[45] Mar. 3, 1981

[54] POWER FACTOR MONITORING AND CONTROL SYSTEM FOR RESISTANCE WELDING

[75] Inventor: Dennis J. Jurek, Grafton, Wis.

[73] Assignee: Square D Company, Palatine, Ill.

[21] Appl. No.: 6,990

[22] Filed: Jan. 29, 1979

[51] Int. Cl.³ .......................... G06F 15/46; B23K 9/10
[52] U.S. Cl. .................................... 364/477; 219/110; 364/482; 364/483
[58] Field of Search ............... 364/477, 482, 483, 511, 364/552; 219/108, 109, 110; 324/140 R, 142

[56] References Cited

U.S. PATENT DOCUMENTS

| | | | |
|---|---|---|---|
| 3,518,399 | 6/1970 | Vanderhelst | 219/110 |
| 3,694,615 | 9/1972 | Brandeis | 219/110 X |
| 3,746,829 | 7/1973 | Petzold | 219/110 |
| 4,001,540 | 1/1977 | Drake et al. | 364/477 X |
| 4,034,212 | 7/1977 | Paxton | 364/477 X |
| 4,079,226 | 3/1978 | Boyd et al. | 219/110 |

Primary Examiner—Joseph F. Ruggiero
Attorney, Agent, or Firm—Michael J. Femal

[57] ABSTRACT

A Power Factor Monitoring and Control System for controlling the quality of a spot weld made in the automotive industry on assembly line welders. The quality and strength of a spot weld can be correlated to a drop in resistance during the fusion process. Rather than measuring this resistive drop at the welding electrodes by attaching external sensing means thereto, the control system of the present invention makes use of the phenomenon that a resistive drop also causes a change in the total load power factor further resulting in a change to the current extinction angle of a weld half cycle. By determining the amount of increase or decrease that has occurred in the current extinction angle during a weld or a group of welds, a basis for the control of the welding heat is obtained.

5 Claims, 5 Drawing Figures

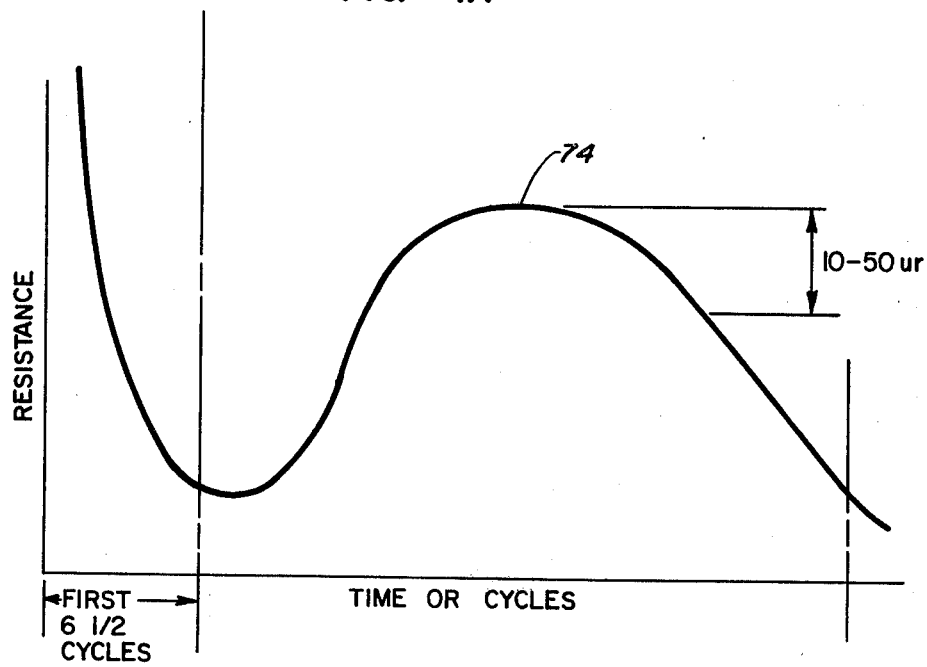
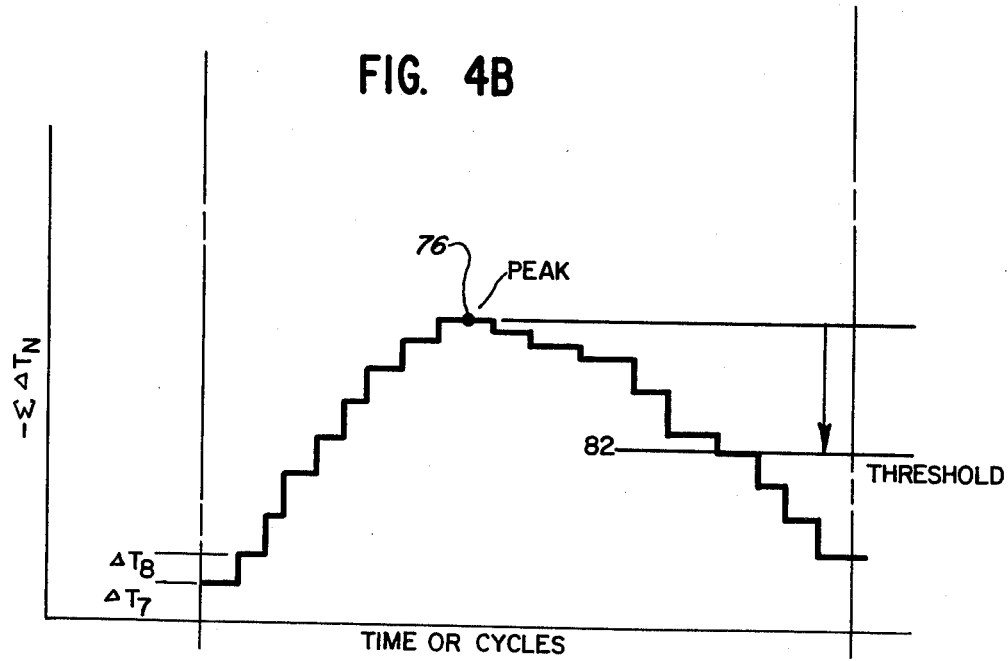

POWER FACTOR MONITORING AND CONTROL SYSTEM FOR RESISTANCE WELDING

BACKGROUND OF THE INVENTION

This invention relates to a power factor monitoring and control system for resistance welding, and more particularly, to a control which senses the resistive drop that occurs in the formation of a quality weld in the secondary of a welding transformer by monitoring the corresponding change in the total load power factor as sensed in the primary of a welding transformer to provide an automatic heat control for improving weld quality over the tip life as well as reducing power consumption.

Resistance welding is now widely used in most applications involving the joining of metal, such as mild steels used in the manufacture of automobiles, and is recognized by all users as a most economic and rapid process when properly applied. Nevertheless, there are a number of parameters in the welding process that must be monitored in order to provide a quality weld. One such parameter which must be carefully monitored is the wear of the welding electrodes (tips) which must be compensated for by increasing the weld heat in order to insure good quality welds throughout the tip life.

Typically, prior art attempts at assuring weld quality despite tip wear (mushrooming) included the following monitoring (feedback) control techniques:

1. Optical (infrared), i.e., monitoring surface radiation to assess weld quality;
2. Weld expansion, i.e., monitoring electrode displacement (thermo-expansion);
3. Ultra-sonic, i.e., monitoring ultra-sonic transmissions transmitted through the weld area during the weld formation process;
4. Weld energy, i.e., monitoring weld energy during the formation of the weld;
5. Acoustic emmissions (expulsion detector) i.e., monitoring the acoustic emissions occurring during weld formation; and
6. Resistance change i.e., monitoring the resistance change occurring during the weld formation.

Specifically, all of the above prior art techniques of monitoring weld quality were implemented by attaching or positioning various sensors and their respective leads in direct contact with the welding electrodes or in close proximity, thereto. Unfortunately, these monitoring devices and their leads attached to or in close proximity to the welding electrodes, that work so well in a laboratory environment when manned by expert technicians, seldom stood up in an industrial environment in which welding machines are sometimes manned by unskilled operators on an assembly line. The results in many cases were damaged monitoring devices as well as severed leads thereto which make it impossible to monitor the quality of the weld.

For the above stated reasons, monitoring devices and their leads attached to or in close proximity to the welding electrodes are often inadequate to assure good quality welds throughout the tip life because of continual maintenance problems. Examples of the above type of monitoring techniques and associated devices are contained in a publication entitled "Resistance Welding Control and Monitoring" published by The Welding Institute located at Abington Hall, Abington, Cambridge, CB 16Al, United Kingdom, copyrighted 1977.

One succesful way to compensate for electrode wear without attaching monitoring devices next to or on the welding tips is found in the digital welder control system of U.S. Pat. No. 4,104,724 ('724 patent). The controller of this patent provided a maintenance interval counter and compensator control having a 4-step, stepper. The stepper control of this patent is used to automatically increase the weld heat after a preset number of welds based on past experience to compensate for electrode mushrooming. Moreover, the digital welder control system of this patent is hereby incorporated by reference as to a type of digital welder control system that is ideally suited for modification to incorporate the features of the present invention.

SUMMARY OF THE INVENTION

With this invention, the foregoing problems are substantially solved. The power factor monitoring the control system for resistance welding utilizes similar circuits and control modules as shown in the '724 patent. Again, an 8-bit microprocessor identical to the one described in the '724 patent functions as a main control element. The microprocessor's known cycle time to execute an instruction is used to generate a real time period representing the time between the zero crossing of the line voltage and the end of current conduction. An automatic power factor circuit (hereinafter called APF) senses the current through the Silicon Controlled Rectifier (hereinafter called SCR) welding contactors which control the current to the primary of the welding transformer. When the APF circuit senses the end of current conduction of each half cycle, it generates a conduction signal directly related to the current extinction angle of each half cycle. Since the quality and strength of a spot weld can be correlated to a resistive drop of 10 to 50 microhms from the maximum resistance in mild steels measured through the weld as the weld progresses during the fusion process, we only need to determine if this resistive drop has occurred in order to ascertain that a good quality weld was made. Fortunately, this resistive drop in the secondary circuit of the welding transformer is reflected back to the primary of the welding transformer as change in the total load power factor as evidenced by change in the current extinction angle to each weld half cycle. The APF conduction signal is a time related indication of this resistive drop.

A polarity detector circuit across the line voltage detects the polarity of the line voltage, and therefore, when the zero crossing of the line voltage takes place, the detector produces a signal which goes through a transition at this point in time to start the initial timing of the real time period. The zero voltage crossing signal from the detector together with the conduction signal from the APF circuit are used to define the beginning and end of the time period which correlates to the change in resistance that occurs during the weld. These two signals are fed to the microprocessor which performs a timing function on them to recreate the dynamic resistance curve and when the resistive drop of 10 to 50 microhms from the maximum resistance in mild steels has occurred, the microprocessor terminates the weld. In the present invention, the heat of the weld is increased as the tips deteriorate and mushroom by varying the time in the representative heat equation of $H = I^2 rt$ as is well known in the art. In other words, the number of cycles per weld are increased as the tips deteriorate and mushroom. Although the 4-step, stepper control of the '724 patent is not used in conjunction with the present invention, it is possible if a weld extends beyond the zero to 59 cycle timing period that the 4-step, stepper control can be used to increase the weld heat to a next step thereby reducing the number of weld cycles required to bring the weld back within the zero to 59 cycles timing period which is common to all weld sequences in the digital welder control system of the '724 patent.

Accordingly, a principle object of the present invention is to provide a power factor monitoring and controll system for resistance welding in which the quality of the weld is determined by measuring the resistive drop associated with a quality weld in the secondary circuit of the welding transformer by sensing the power factor change in the primary circuit of the welding transformer thereby eliminating the necessity of attaching monitoring devices and their respective leads in close proximity to the welding electrodes.

Another object is to provide a power factor monitoring and control system for resistance welding in which deterioration of the welding electrodes is automatically compensated for by increasing the number of weld half cycles until the resistive drop associated with a quality weld occurs.

A further object is to provide a power factor monitoring and control system for resistance welding which reduces the complexity of the devices and associated circuitry required to determine a quality weld, and which eliminates the necessity of connecting any external monitoring circuitry to the secondary circuit of the welding transformer.

Still another object is to provide a power factor monitoring and control system for resistance welding in which a simulation of the actual dynamic resistance curve in resistance welding is reproduced by the control for determining when the resistive changes associated with a quality weld has occurred for terminating the weld.

Other objects and advantages will become apparent from the description wherein reference is made to accompanying drawings illustrating the preferred embodiment of the invention.

BRIEF DESCRIPTION OF THE DRAWINGS

FIG. 4A shows the characteristic dynamic resistance curve of mild steels in resistance welding occurring during the half cycles of a weld as shown in FIG. 3; and FIG. 4B illustrates graphically the reproduction of the curve in FIG. 4A by the controller of FIG. 1.

DESCRIPTION OF THE PREFERRED EMBODIMENT

Figure 1:
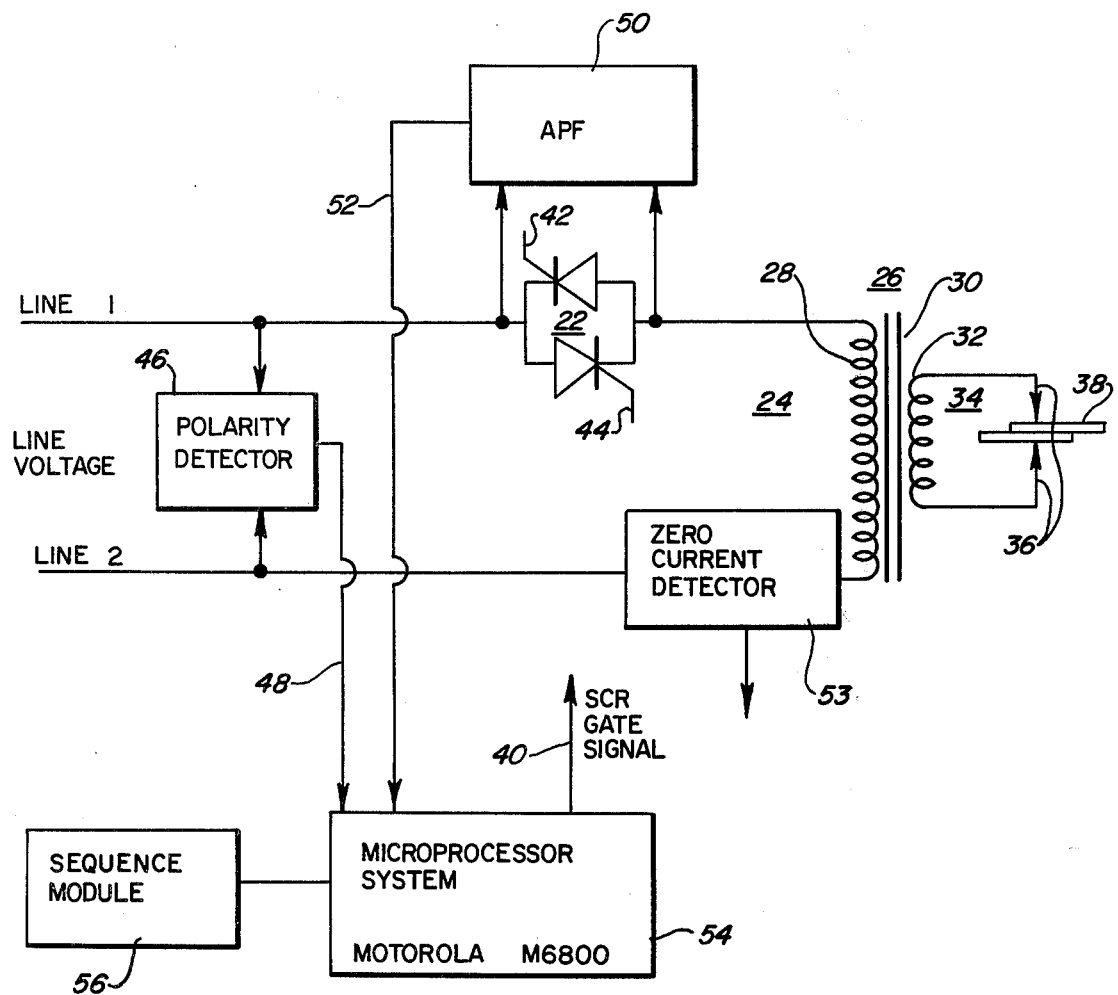
FIG. 1 shows a partial block and schematic representation of a power factor and monitoring control system for resistance welding embodying the principles of the present invention.

Referring to FIG. 1, a pair of inversely connected SCR welding contactors 22 are used to control the current delivered to a primary circuit 24 of a welding transformer 26 including a primary winding 28, an iron core 30, a secondary winding 32, and a secondary circuit 34. The secondary circuit 34 further includes a pair of welding electrodes 36 with work pieces 38 clamped therebetween for a typical spot weld of the type used in the automotive industry.

A primary winding 28 of the welding transformer 26 is connected across lines 1 and 2, respectively, which in turn are connected to a line voltage source of any known value for resistance welding. The control system could be connected to either single phase voltage source as shown or a polyphase voltage source utilizing any known converter in the art. In the case of a polyphase system, duplicate detection circuitry would be associated with each phase. Initiation of current conduction through the SCR welding contactors 22 is controlled by an SCR gate signal 40 which is fed to gates 42 and 44 of the SCR welding contactors 22. The line voltage polarity is determined by a polarity detector circuit 46, which for the purpose of this embodiment, can be considered to produce an output signal of a logic 1 on a line 48 when the voltage on line 1 is positive with respect to line 2. Similarly, an output signal of a logic zero is produced on line 48 when line 1 is negative with respect to line 2. Thus, detector 46 senses the transition of the line voltage from a positive to a negative half cycle as it crosses the zero voltage line. The state of conduction of the SCR welding contactors 22 is determined by an automatic power factor (APF) circuit 50 as described in the '724 patent or in the alternative by a series zero current detector 53 which is well known in the art. The APF circuit 50 senses the voltage across the SCR welding contactors 22 and produces a logic zero output on a line 52 when voltage is present across the SCR welding contactors 22 (this corresponds to the non-conduction state of contactors 22). If a nominal voltage is present across the SCR welding contactors 22, the welding contactors 22 are conducting and the APF circuit 50 generates a logic 1 output on line 52. Both of the output signals on lines 48 and 52 are fed to a microprocessor system 54 which is an 8-bit microprocessor of any known type such as Motorola M6800 as its main control element. The transition of the line voltage from a positive to a negative value produces a polarity output signal corresponding to the zero crossing of the line voltage on line 48. The polarity output signal in conjunction with the conduction signal produced by the APF circuit 50 on line 52 are used to define a time period related to the change of resistance that occurs during the weld.

The microprocessor system 54 consisting of the 8-bit Motorola M6800 microprocessor and its associated memory and various anciliary devices receives the line voltage polarity information on line 48 as well as the state of conduction of the SCR welding contactors 22 on line 52. Then the microprocessor system 54 generates appropriately timed SCR welding contactor gate signals on line 40 and feeds these gate signals to gates 42 and 44 of SCR welding contactors 22 based on operator input data stored in a sequence module 56 such as the desired welding current, the duration of the weld, etc. as fully described in the '724 patent and based on its analysis of the relative timing between the line voltage polarity transition represented by the output on line 48 and the cessation of the conduction of the SCR welding contactors 22 represented by an output signal on line 52.

Figure 2:
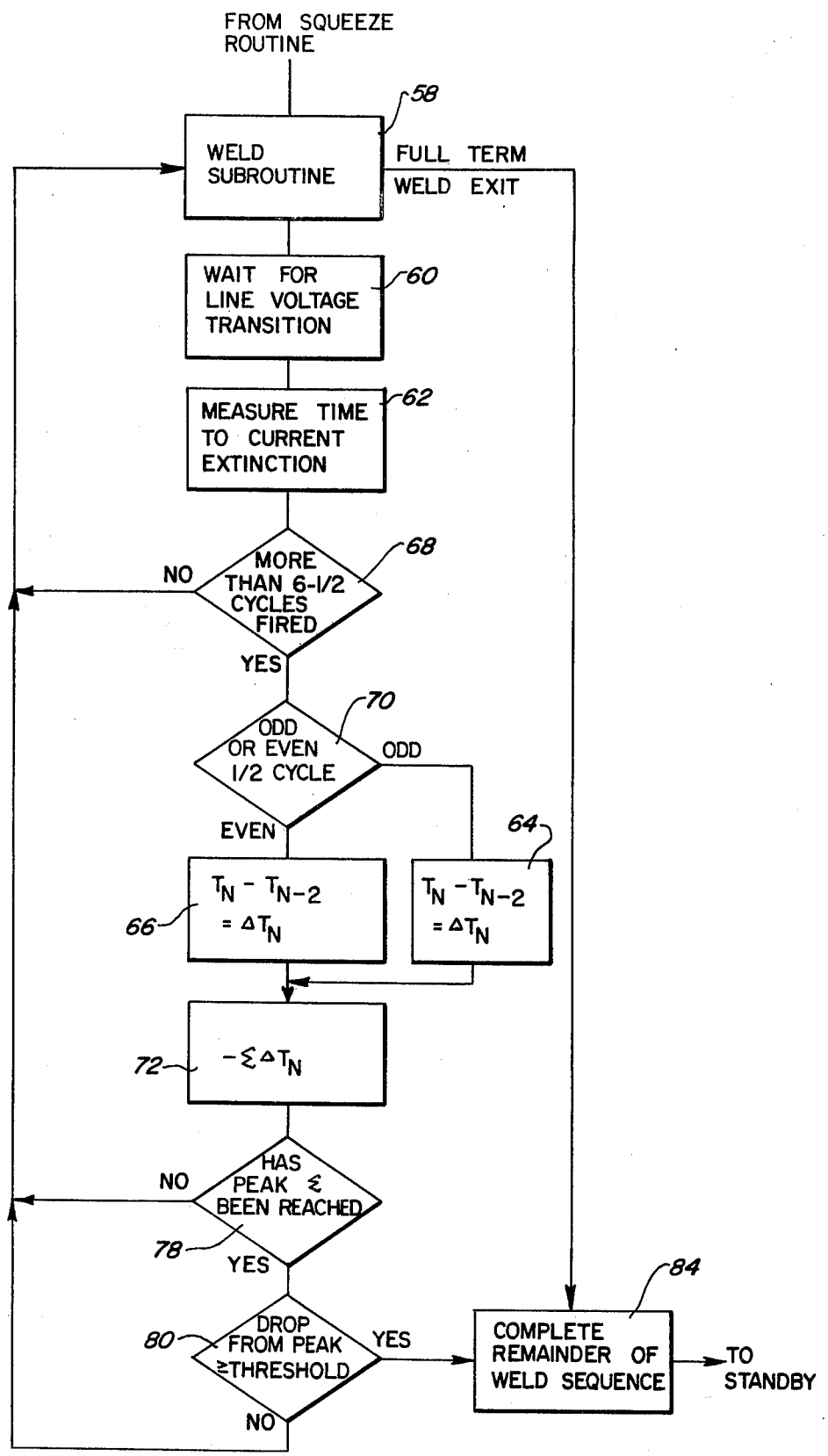
FIG. 2 is a block diagram of a flow chart utilized by the microprocessor of FIG. 1.

Turning now to a partial flow chart as shown in FIG. 2, the operation sequence of the welding control system is similar to that described in the '724 patent with the exception of the measurement of the timing periods.

The analysis of those timing period measurements and decisions is detailed in the flow chart of FIG. 2.

Upon initiation of a weld sequence and the completion of the squeeze time, the microprocessor leaves the squeeze routine and enters a weld subroutine 58. The weld subroutine 58 includes certain checks within it and timing information necessary to fire the SCR welding contactors 22 at the appropriate time. Upon the generation of the SCR gate signal on line 40 which initiates the SCR welding contactors 22 firing, the microprocessor system 54 completes certain internal checks associated with controlling the current and than goes to a wait for line voltage transition state represented by a block 60 where it waits for a transition in the line voltage polarity (a zero crossing of line voltage from one polarity to another). Upon the detection of a line voltage polarity transition by polarity detector 46, the signal on line 48 causes the microprocessor system 54 to enter a 5 microsecond timing loop representing the known cycle time of the microprocessor to execute two instructions one of which adds a one count to an accumulator therein every 5 microseconds until the APF signal generated on line 52 from the APF circuit 50 goes to zero. A measure of time to current extinction block 62 represents this timing loop step on the flow chart in FIG. 2. In other words, the measured time from the line voltage zero crossing to the cessation of current conduction is retained in the accumulator of the microprocessor which then further makes a decision as to whether this timing period corresponds to an odd or even half cycle of current conduction.

Figure 3:
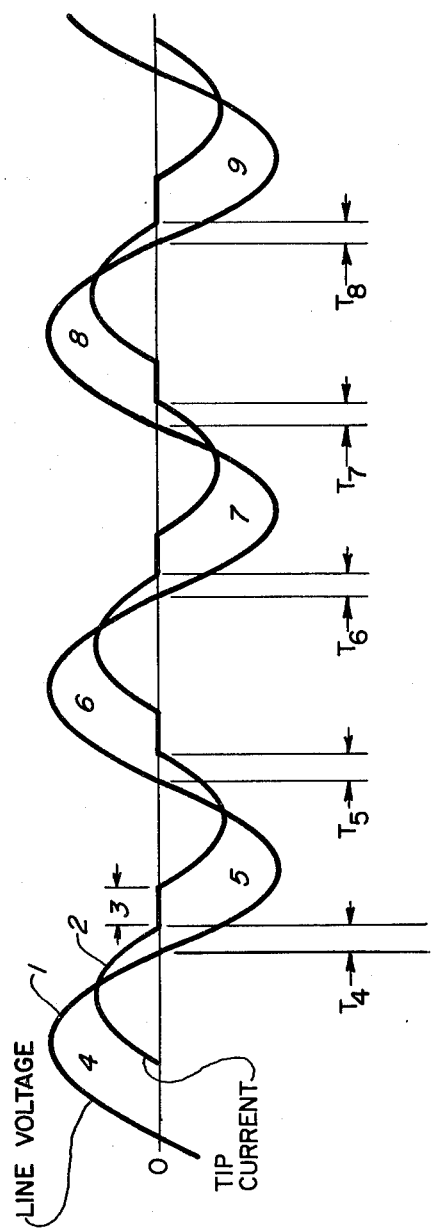
FIG. 3 shows a current and voltage versus time diagrams of the early half cycles in a weld and the last half cycles in a weld which serve to explain the controller of FIG. 1.
Figure 3:
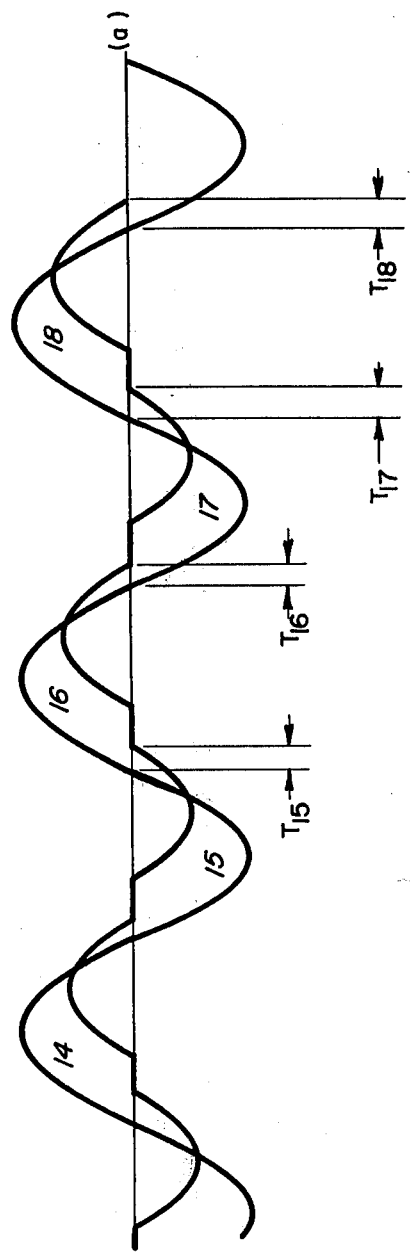

These numerical values in the accumulator representing either the time duration of the odd or even periods are stored in an odd or even memory location for later use by arithmetic blocks 64 and 66, respectively. The numerical value is the time measured from the line voltage zero crossing to the point of current extinction in 5 microsecond increments. In FIG. 3, time period T4 is an example of this increment of time measured from the zero line voltage crossing to the current cessation.

Turning now to FIG. 3, a sinusoidal line voltage waveform 1 is the line voltage applied to the welding transformer 26 of FIG. 1 A tip current waveform 2 represents the current conduction when SCR welding contactors 22 are gated on and off. A time gap 3 in tip current 2 where the SCR welding contactors 22 are gated off, occurs between each half cycle in a weld and time gap 3 remains constant throughout a weld. The weld half cycles are numbered 4, 5, 6, 7, 8, 9 and 14, 15, 16, 17, 18. The earlier half cycles 4–9 represent the portion of the weld corresponding to an increase in resistance as shown in FIGS. 4A and B. Later half cycles 14–18 correspond to the last half cycles in the weld representing a drop in the resistance of the weld after peaks 74 and 76 in FIGS. 4A and B, respectively. Timing periods T4, T5, T6, T7 and T8 represent the time from the zero crossing of the line voltage 1 to the end of welding tip current 2 of each half cycle. In this instance, timing period T4=T5. Timing periods T6, T7 and T8 are smaller than T4 and T5 which indicates that an increase in resistance is taking place in the weld and a that larger power factor value is occurring. T17 equals T18 and both are larger than T15 which is approximately equal to T16 which indicates a smaller power factor value and an increase in the power factor angle.

Referring back to FIG. 2, a decision block 68 is used to prevent an analysis of timing data from the first few half cycles as experience has shown the resistance of the work pieces 38 varies indeterminantly in the early part of the weld and thus does not produce usable data. However, the timing results of half cycles 5 and 6 are retained and stored in the odd or even memory storage locations, respectively. Control of the weld is returned via exit line from decision block 68 directly back to the weld subroutine 58 during the first six half cycles. After the seventh half cycle is fired, decision block 68 leads directly to a decision block 70 which determines whether the half cycle under consideration is numerically odd or even as previously described. In the case of the seventh half cycle which is odd, the microprocessor proceeds to arithmetic block 64 where the time T7 in 5 microsecond increments has subtracted from it, the time of the previous odd half cycle, time T5 in this case. Therefore, the arithmetic equation is $Tn - Tn-2 = \Delta Tn$. Thus, the result of this subtraction forms Delta T7. In case of the next half cycle, an even half cycle, arithmetic block 66 is used to form Delta T8 which is equal to time T8 minus Time T6 ($\Delta T8 = T8 - T6$). In this manner, the Delta T's for all the subsequent half cycles are formed. Moreover, it has been found necessary to form the Delta T's on an odd minus odd and even minus even basis in order to cancel out polarity sensitive timing errors such as rectification at the tips due to oxide and other impurities, unequal response times of SCR welding contactors, etc.

It can be shown that for all small changes in resistance, Delta T's derived in this manner are proportional to the negative time derivative of the resistance versus time function of the dynamic resistance curve produced in the process of a weld as shown in FIG. 4A. But to obtain a numerical representation of the resistance versus time function suitable for analysis by the microprocessor, it is necessary to form the negative intergral of the Delta T function. In numerical terms, this is accomplished by the summation shown in summation block 72. If the output of the block were to be plotted with respect to time or weld cycles, a curve similar to FIG. 4B would result which is an approximation of that dynamic resistance curve in FIG. 4A. The height of the curve at any point is equal to sum of the Delta T's which have been accumulated to that point.

Studies of the weld strength versus resistance have long shown that weld quality can be correlated with the amount of decline in resistance after peak 74 in FIG. 4A is reached, also approximated by peak 76 in FIG. 4B. Next, a decision block 78 determines if this peak has occurred and, if so, a decision block 80 measures the drop from the peak value 76 in FIG. 4B and compares this value to a threshold value 82 as seen in FIG. 4B which is preset by the operator. If the peak is not yet reached then the control exits decision block 78 via a logic no line back to weld subroutine 58. If, on the other hand, the drop from the peak 76 is equal to or greater than the threshold value as determined by decision block 80, the microprocessor no longer returns to the weld subroutine 58 but goes on to operation block 84 where it carries out the operations that complete the weld sequence. Exiting operation block 84, the microprocessor goes to standby where it awaits another trigger initiation from the operator. In this way, the current to the weld is always terminated when an appropriate resistive drop occurs associated with a quality weld.

Moreover, it has been determined in the present invention that the resistance welder load in the secondary circuit 34 as seen from the primary side of the welding transformer 26 can be approximately represented by a series circuit consisting of an inductive component resulting from the transformer leakage reactance, a secondary loop reactance, and resistive components consisting of all the resistances including the resistance of work pieces 38. In terms of the primary circuit 24, secondary impedences are reflected as the square of the turns ratio.

Under conditions of a sinusoidal driving voltage and uninterrupted current conduction, the current will lag the voltage an angle commonly referred to as the power factor angle. If the resistance component is made larger, the power factor angle becomes smaller and, conversely, if the resistance is made smaller, the power factor angle becomes larger. Thus, by observing changes in the power factor angle, changes in the resistance can be measured.

In the case where the current is interrupted by the action of the SCR welding contactors 22 as seen in FIG. 3 waveform, an analogous effect is observed. That is, the current extinction angle with respect to the voltage zero crossing behaves in a manner similar to the power factor angle in the uninterrupted current case. If the resistance is increased, the current extinguishes (goes to zero) at a smaller angle. If the resistance decreased, the current extinguishes at a larger angle.

Referring now to FIG. 3, if the resistance increase were to occur between the half cycles of current associated with voltage half cycle 5 and 6, time period T6 would be smaller than time period T4 and T5. Thus the difference in time Delta T6, between T6 and T5 or T4 would be negative and for small changes in resistance, proportional to the change in resistance through the work pieces 38. Later in the weld period, a fall in resistance will occur, say between half cycles 15 and 16. The fall in resistance will be observed as a positive Delta T17. As can be seen from FIGS. 4A and 4B a resistance increase means we are to the left of peaks 74 in FIG. 4A and 76 in 4B and a resistive drop would be to the right of the peaks 74 and 76, respectively.

I claim:

1. A power factor monitoring and control system for controlling the quality of a weld in resistance welding including a welding transformer having primary and secondary circuits, a line voltage applied to the primary circuit and a load circuit in its secondary circuit, the improvement comprising:
   means for detecting a polarity change in the line voltage applied to the primary circuit to generate a first logic signal;
   means for detecting current extinction in the primary circuit at the end of each half cycle of current conduction in the weld to generate a second logic signal;
   means responsive to the first and second logic signals for measuring the time interval between the first and second logic signals of each half cycle;
   means for converting the measured time intervals into a numerical representation of the resistive change in the load circuit; and
   means for comparing the numerical representation to a preselected threshold value of resistive change representing a quality weld and when the numerical representations are equal to, or greater than, a preselected threshold value then said comparing means generates a control signal to terminate the weld.

2. The control system of claim 1, wherein said first logic signal detecting means is a polarity detecting circuit which senses the zero crossing of the line voltage and in response thereto generates said first logic signal.

3. The control system of claim 1, wherein said second logic signal detecting means is an automatic power factor circuit connected across a pair of inversely connected SCR welding contactors which senses the state of current conduction therethrough and in response thereto, when current conduction stops at the end of each half cycle of conduction, generates said second logic signal.

4. The control system of claim 1, wherein said second logic signal detecting means is a zero current detector connected in series with the primary circuit which senses the state of current conduction and in response thereto, when current conduction stops at the end of each half cycle of conduction, generates said second logic signal.

5. In a power factor monitoring and control system for controlling the quality of a weld in resistance welding including a welding transformer having primary and secondary circuits, a line voltage applied to said primary circuit, a method of determining the resistive change in the secondary circuit of the welding transformer by measuring the power factor change in the primary circuit thereof comprising the steps of:
   detecting a zero crossing of the line voltage in the primary circuit of the welding transformer to generate a first logic signal;
   detecting current extinction in the primary circuit at the end of each half cycle of conduction in a weld to generate a second logic signal;
   measuring the time interval between the first and second logic signals of each half cycle of conduction;
   converting the measured time intervals into a numerical representation of the resistive change taking place in the secondary circuit as the weld progresses;
   comparing a portion of the numerical representation to a preselected threshold value of resistive change indicating a quality weld for that particular material; and
   terminating the weld when the numerical representation is equivalent to the threshold value.

* * * * *